(12) United States Patent
Chen et al.

(10) Patent No.: US 6,210,843 B1
(45) Date of Patent: Apr. 3, 2001

(54) MODULATION OF PERIPHERAL CRITICAL DIMENSION ON PHOTOMASK WITH DIFFERENTIAL ELECTRON BEAM DOSE

(75) Inventors: Fred T. Chen, San Jose; Wilman Tsai, Saratoga, both of CA (US); Yoshihiro Tezuka, Tokyo (JP); Steven Labovitz, Santa Clara; Jeff N. Farnsworth, Los Gatos, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/447,088

(22) Filed: Nov. 22, 1999

(51) Int. Cl.$^7$ .................................. G03F 9/00; G03C 5/00
(52) U.S. Cl. ................................. 430/5; 430/394
(58) Field of Search .......................... 430/5, 322, 323, 430/324, 394, 311, 313; 438/758, 759

(56) References Cited

U.S. PATENT DOCUMENTS 5,728,507 * 3/1998 Rhoades et al. ..................... 430/313
6,027,865 * 2/2000 Andoh ................................. 430/396

* cited by examiner

Primary Examiner—S. Rosasco
(74) Attorney, Agent, or Firm—Blakely, Sokoloff, Taylor & Zafman LLP (57) ABSTRACT

A method is described comprising depositing a layer of resist on a mask substrate having transparent and opaque layers. The resist layer is then exposed to radiation. The radiation is patterned to produce features within an active device area and a moat surrounding the active device area. The radiation is also controlled to have a differential increased incident energy in the moat area of the mask compared to the active device area. Specifically, the exposure dose applied to the moat is greater than that normally required to completely remove the resist during the developing stage. The magnitude of the additional exposure dose is empirically derived and is based upon such factors as the type of resist and the thickness of the resist.

20 Claims, 5 Drawing Sheets

(Prior Art)

FIGURE 4

MODULATION OF PERIPHERAL CRITICAL DIMENSION ON PHOTOMASK WITH DIFFERENTIAL ELECTRON BEAM DOSE

FIELD OF INVENTION

The field of the invention relates to semiconductor manufacturing lithography technology, and more specifically, to a technique designed to improve critical dimension control.

BACKGROUND OF THE INVENTION

The various conducting lines and other features found within a semiconductor chip are created by lithographic means. That is, light is passed through a mask work focused onto a semiconductor substrate surface coated with a resist. The mask contains opaque and transparent areas such that, for negative resists, opaque regions correspond to the desired features formed on the semiconductor wafer surface, such as transistor gates or metal interconnection lines. Alternatively, if a positive resist is used, the transparent regions correspond to the desired features.

The critical dimension of a semiconductor process is used to refer to the smallest achievable dimension for the process. Currently, a horizontal critical dimension of modern semiconductor devices is about 0.13–0.25 micron ($\mu$m). The projection optics of today's most advanced exposure tools reduce the optical image from the mask by approximately 4:1. Thus, the critical dimension of today's leading edge masks is approximately 0.52 to 1.0 um (4×0.13 to 0.25=0.52 to 1.0).

Figure 1:
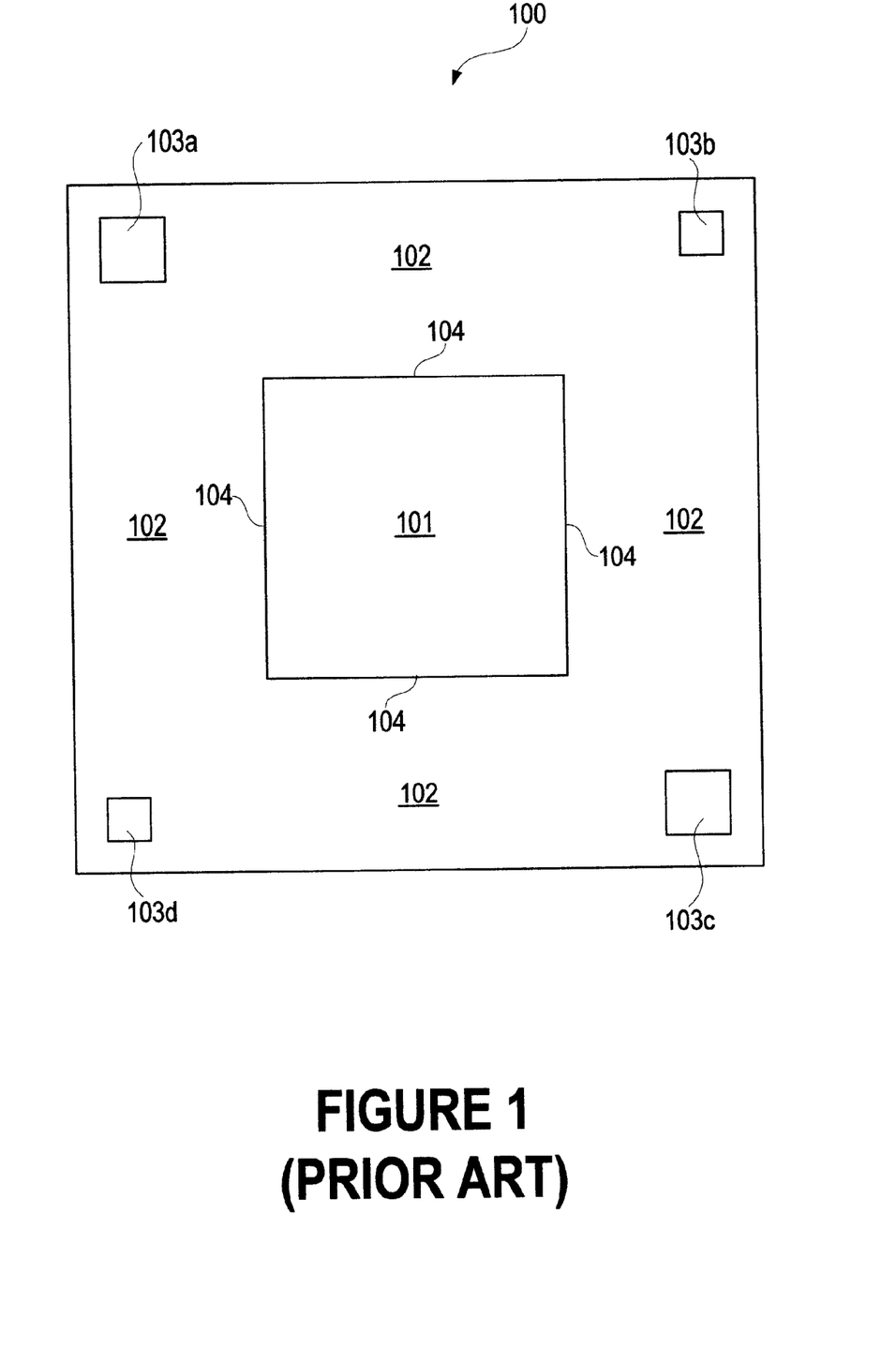
FIG. 1 shows a typical mask according to the prior art.

A problem with masks is the variation of the mask's critical dimension at the outer edge of a die pattern. That is, as shown in FIG. 1, a mask 100 typically has a central area 101 having the various features formed on the semiconductor die. This central area 101 is also referred to as a die pattern, an active area, an active device area or the like. The area outside the active device area, referred to as the inactive area 102, is largely unused space. For the most part, the most meaningful features on the mask are those that help create the features on the silicon chip which are within the active area 101. Typically, alignment features 103a–d used for mask alignment purposes are the main features used within the inactive area 102.

Figure 2A:
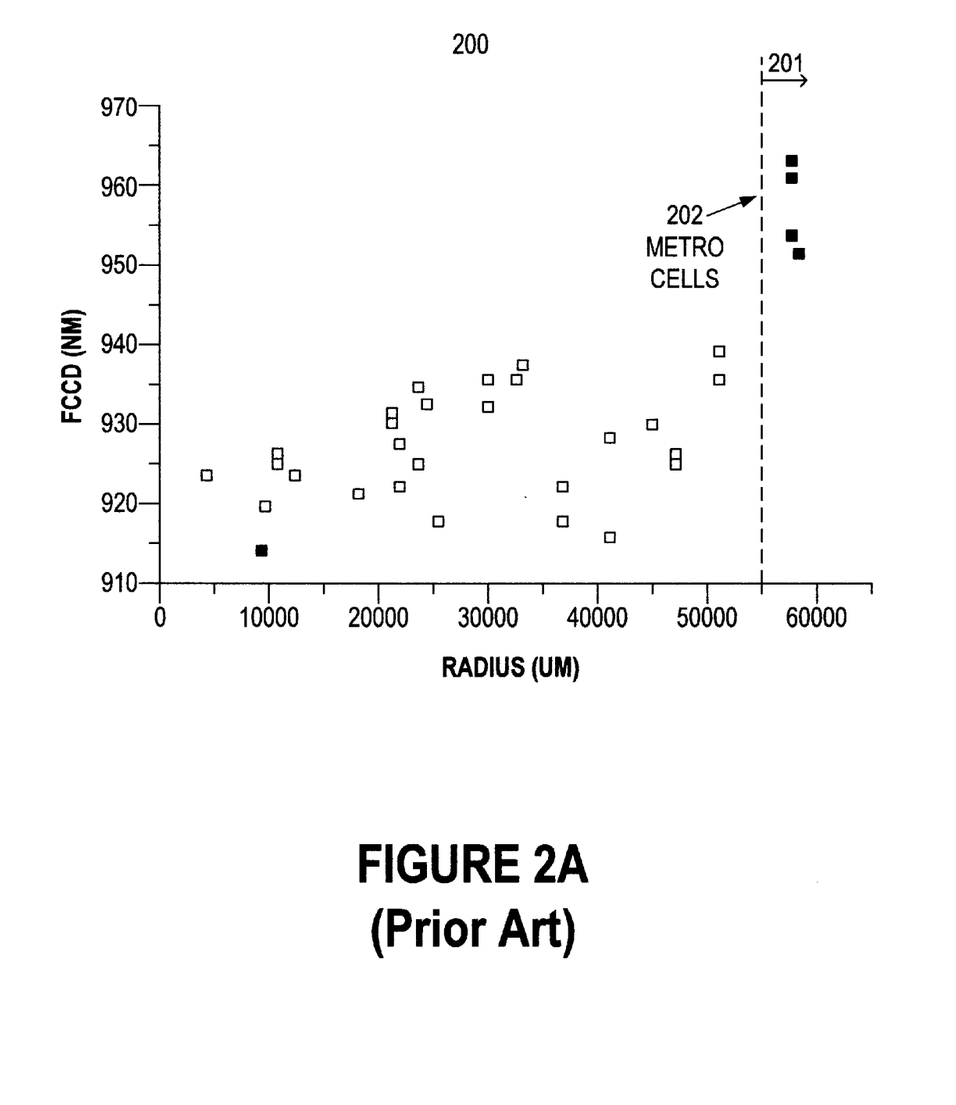
FIG. 2a shows critical dimension versus mask radius without moat correction.

It has been observed that the smallest achievable feature size, e.g. a critical dimension, on the mask increases at the outer edge 104 of the active area 101. For example, FIG. 2a shows the variation 200 of a mask's Final Check Critical Dimension (FCCD) with the mask's radius. From FIG. 2A, toward the outer edge of the active area 201, approximately 55000 $\mu$m from the mask's center in this example, there is a sharp increase in the critical dimension range from approximately 0.910–0.940 $\mu$m to 0.950–0.965 $\mu$m.

Figure 2B:
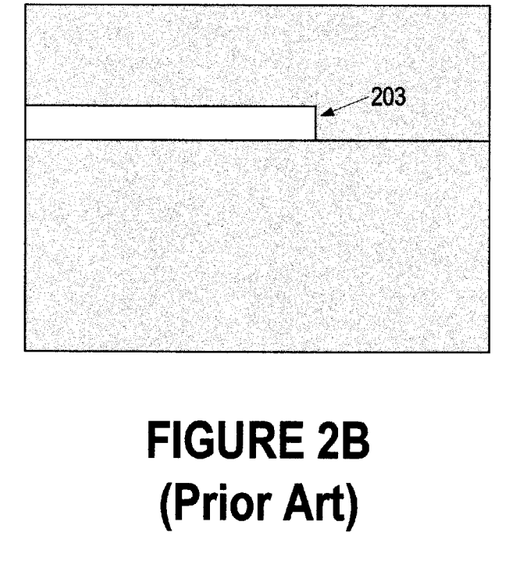
FIG. 2b shows an inner feature edge.
Figure 2C:
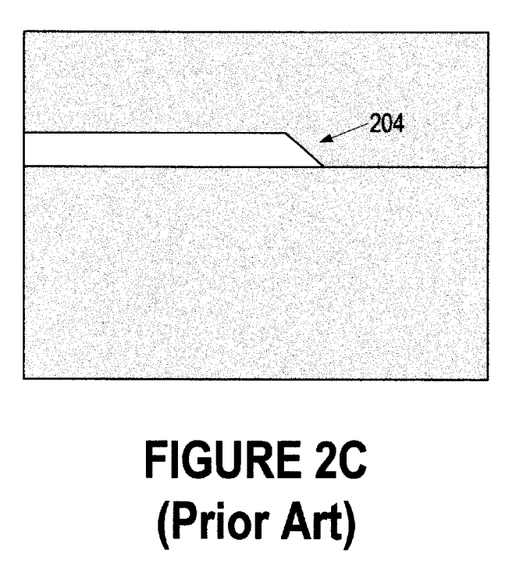
FIG. 2c shows a metro cell edge.

This sharp increase in the critical dimension range usually affects features commonly referred to as metro cells. Metro cells 202 are a set of features used for the alignment of a lithographic stepper. As metro cells are usually placed near the outer edge of the active area 104 (referring briefly back to FIG. 1), metro cells 202 tend to be more distorted than other features. Thus FIG. 2a shows the critical dimension of the metro cells 202 within an undesired 0.950–0.965 $\mu$m critical dimension range. FIG. 2b shows a scanning electron microscope (SEM) photograph of an inner feature edge 203 that is within a mask's active device area (101 of FIG. 1) and sufficiently far from the active device area edge (104 of FIG. 1). FIG. 2c shows an SEM photograph of a metro cell edge 204 from the same mask as that shown in FIG. 2b. The loss of critical dimension control is seen by comparison of FIG. 2b with FIG. 2c. The metro cell's edge 204 is substantially more sloped than the inner feature edge 203. This results in a larger metro cell 202 critical dimension.

The inability to keep the metro cell's critical dimension within a normal range such as 0.910–0.940 $\mu$m results in manufacturing inefficiencies. Specifically, the mask has to be manually or custom exposed in order to compensate for the distortion to the metro cell. This custom exposure procedure slows down the manufacturing process resulting in added expense, such as through wasted time. If the metro cell critical dimension could be manufactured within the same range as the features within the active area, the custom exposure procedure may be eliminated resulting in substantial savings to current manufacturing costs.

Various reasons are postulated for the variation in critical dimension (CD) at the peripheral regions of a photomask. Among them are resist thickness non-uniformity, resist develop rate/profile non-uniformity, and etch loading effects. Thus, prior research has concentrated on resist develop analysis and plasma etching.

SUMMARY OF THE INVENTION

A method of forming a photomask having an active device area and an inactive area is disclosed. First, a resist layer is deposited on a mask substrate having a transparent layer and an opaque layer. Then, the resist layer is selectively irradiated on the active device area to produce features within the active device area. The resist layer is also selectively irradiated on at least a portion of the inactive area.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method is described involving depositing a layer of resist on a mask substrate having transparent and opaque layers, and then exposing the resist layer to radiation. The radiation is patterned to produce features within an active device area. The radiation is also controlled to provide incident energy in the frame area of the mask.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Figure 3A:
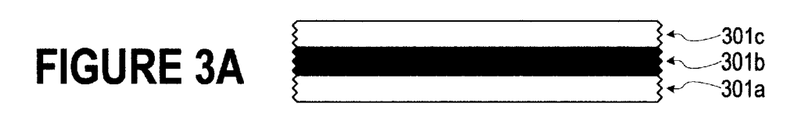
FIG. 3a shows material used to form a mask.

In order to address the critical dimension variation at the outer regions of the active area, the process of mask making should be understood and some theories should be discussed as to why the variation occurs. FIG. 3 shows the general process of manufacturing a mask. FIG. 3a shows the material 301 typically used to form a mask. The material 301 is typically a three level multilayer structure, however, other structures are possible. The first layer 301a is a transparent material usually comprised of quartz. However, other materials such as fused silica, fluorinated fused silica and $CaF_2$ may be used as well.

The second layer 301b is an opaque material such as chromium (Cr) or other metallic material. Other materials may be used for the opaque material such as CrF, or silicon containing materials such as MoSi, NiSi and TiSi. Dielectric absorbing materials may also be used. Also, an anti reflective coating (ARC) 301c may be placed atop the opaque material 301b. The ARC thickness is typically a quarter wavelength of the exposure radiation used during semiconductor device processing. For UV or deep UV applications (having wavelengths from approximately 1E-7 to 1E-8 meters) the thickness of the ARC typically ranges from 300 to 25 angstroms. The ARC is used to reduce optical flaring. The ARC is typically comprised of $CrO_xN_y$. The ranges of x and y are well known in the art. However, materials such as CrO, SiN and TiN may also be used.

The method described herein is also applicable to manufacturing masks for all the Next Generation Lithography (NGL) techniques, including extreme ultraviolet lithography (EUV), X-ray lithography, electron-beam projection and ion projection lithography. The discussion herein may also be used for phase shifting masks. The appropriate substitution for the substrate and opaque layers may be made by those skilled in the art.

Figure 3B:
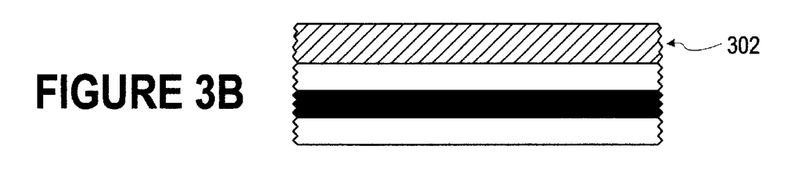
FIG. 3b shows the material of FIG. 3a covered with resist.

The general idea is that transparent regions are created by etching away the opaque material 301b, along with the ARC in those embodiments employing an ARC, at specific regions where transparent areas are desired. Similar to semiconductor device manufacturing, mask features are formed by a lithographic process. Thus, as shown in FIG. 3b, a resist layer 302 is first formed over the surface. The resist material may be a polymeric material such as polymethylmethacrylate (PMMA), polybutene-1-sulfone (PBS), or the methylstyrene and chloromethyacrylate (ZEP) family of chlorinated polymers. However, other materials such as Chemical Amplified Resists (CAR), among others, may be used as well.

Figure 3C:
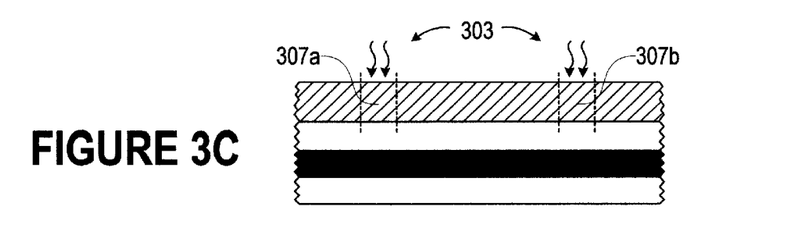
FIG. 3c shows the resist of FIG. 3b exposed to radiation.

After the resist layer 302 is formed, it is exposed to radiation 303 such as an electron beam (E-beam) according to E-beam projection techniques, an ion beam or a laser beam as shown in FIG. 3c. The source for radiation 303 typically capable of directly writing the desired features in a custom fashion into the resist layer 302. That is, different semiconductor chips typically have unique mask sets having their own unique patterns and features.

For a positive resist 302 as shown in FIG. 3, typically, the source for radiation 303 causes bond breaking between polymer chains within the resist layer 302. This makes resist regions exposed to the source for radiation 303. In other words, resist regions 307a and 307b are easily removed by a subsequent typically wet develop process. Alternatively, for negative resists, the radiation source 303 causes bond formation between polymer chains within the resist layer making the non-exposed regions easily removed by a subsequent, typically, wet develop process. Thus, for a resist layer 302 that is a positive resist, "written to" regions 307a and 307b are removed after the wet develop process. Accordingly, for negative resists, "written to" regions 307a and 307b remain after the wet develop process.

Figure 3D:
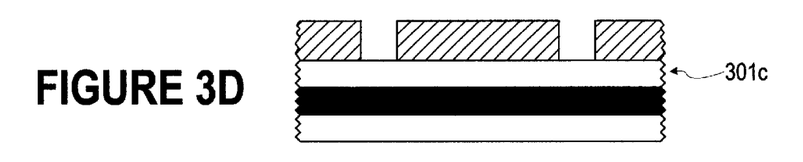
FIG. 3d shows the resist of FIG. 3c after an etch.

For positive resists, after exposing the entire mask surface to a typically wet develop process, the resist is removed at the written to regions, such as regions 307a and 307b, which ultimately exposes the underlying mask material 301c as shown in FIG. 3d. If a mask without an ARC layer 301c is used, in regard to the example of FIG. 3, opaque layer 301b would be exposed.

Figure 3E:
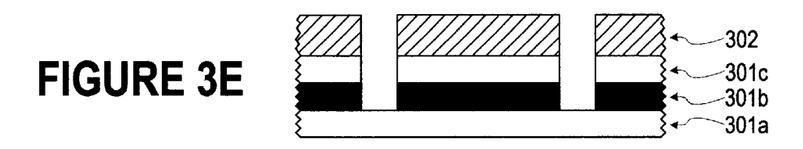
FIG. 3e shows the material of FIG. 3a after an etch.

A subsequent dry etch, such as a reactive ion etch (RIE) or magnetic—enhanced reactive ion etch (MERIE), is typically employed to remove the opaque layer 301b and ARC 301c as shown in FIG. 3e which exposes the transparent layer 301a. During these dry etch processes, a gas is broken down into smaller reactive radicals such as fluorine or chlorine, which adsorb onto the exposed surface layer, such as opaque layer 301b, chemically react with and then removing surface layer atoms. This adsorption, reaction and removal activity is commonly referred to as reactive ion etching (RIE). Other etch techniques, such as magnetron, inductively coupled plasma, neutral loop discharge, electron cyclotron resonance, helicon, or helical resonator may also be employed.

Figure 3F:
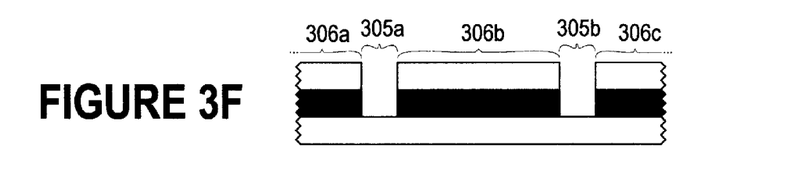
FIG. 3f shows the material of FIG. 3e after the resist is removed.

The completed mask, having transparent regions 305a and 305b and opaque regions 306a, 306b, and 306c are formed once the resist layer 302 is removed as shown in FIG. 3f.

FIG. 1 shows a top view of a typical completed mask 100, such as a mask at the stage corresponding to FIG. 3f. Note that, typically, inactive area 102 may correspond to an opaque area, while alignment features 103a,b,c,d may correspond to transparent areas. The active area 101 has the complex features associated with a semiconductor chip, and has many small, complicated opaque and transparent regions in close proximity to each other.

Because inactive area 102 may be mostly opaque, the active device area 101 is surrounded by a region of, such as chromium, that is not etched during the mask manufacturing process. Thus, referring to FIG. 1 and FIG. 3, the inactive area 102 may have a layer of resist 302 over it through most of the manufacturing process before the final resist removal step of FIG. 3f.

A theory that correlates the loss of critical dimension control at the die area edge as shown in FIG. 2a with the presence of large amounts of resist layer 302 in the area surrounding the active area 101 concerns resist loading. Resist loading is the local dependence of etch rates on resist patterning density. Referring back to FIGS. 3e and 3f, CD control may possibly be a function of the etching of the resist layer 302. For example, the resist layer 302 may consume plasma species which affects CD control.

As such, the amount of resist 302 that is available to consume plasma species within and proximate to a local region is a factor in the etch rates that occur at that local region. Local regions having more resist will have slower resist etching rates since relatively more plasma species are consumed.

Referring to FIG. 1, modulating the amount of available resist within and/or proximate to the active device area edges 104 may therefore be employed to control the etching activity near the active device area edges 104 and prevent the aforementioned CD variation. One solution to the problem involves introducing some form of transparency to the inactive area 102 in the completed mask in order to reduce the amount of resist. This may be accomplished by designing into the mask a pattern that corresponds to an area of exposed opaque material like second layer 301b in the inactive region 102 during the opaque layer etch step. This exposed area of opaque layer material corresponds to a transparent region in the inactive region 102 after the mask manufacturing process is completed. The formation of a transparent region results in a moat-like structure, hence the name given to this structure, that surrounds the active device area 101.

Figure 4:
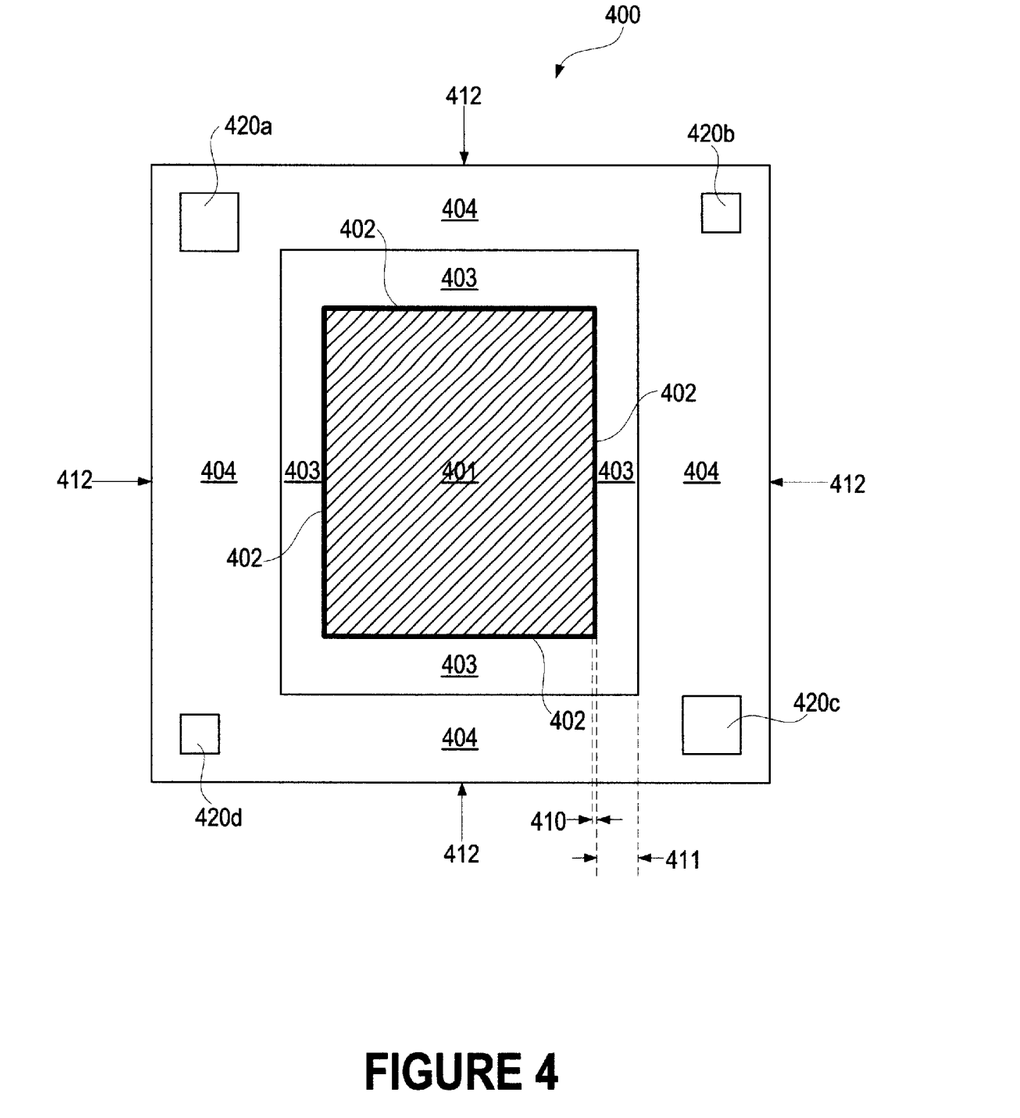
FIG. 4 shows a mask formed in accordance with the present invention.

An embodiment of such a mask design is shown in FIG. 4. FIG. 4 shows an active device area 401, an opaque alignment frame 402, a transparent moat 403 and the remaining inactive region 404. This particular embodiment addresses a positive resist mask making process. Although the moat 403 completely surrounds the active area 401, the moat 403 need only extend around a substantial portion of the periphery of the active area 401. For example, the moat 403 may only surround 75% of the periphery of the active area 401.

The opaque alignment frame 402 is used to align the optical exposure tool during the manufacture of the semiconductor device. Since the opaque alignment frame 402 introduces a boundary between the active device area 401 and transparent moat 403, the opaque alignment frame width 410 should be reduced to a minimal width needed to properly align the manufacturing equipment. Wider widths are acceptable, however, provided critical dimension control is maintained.

Opaque alignment frame width 410 may also vary according to the various equipment intended to be used with the mask if the various equipment have different minimum frame width 410 tolerances. The opaque alignment frame width 410 is also typically uniform around the active device area 401 edge. However, different equipment may deviate from a uniform frame width in order to maximize alignment accuracy.

The embodiment of FIG. 4 shows the opaque alignment frame 402 immediately surrounding the active device area 401. However, other embodiments depending on the equipment employed may insert the opaque alignment frame 402 within the transparent moat 403 as well. This may be desirable since it removes the resist layer material further away from the active device area 401 edge. Again, the amount of distance depends upon the specific alignment frame requirements and/or alignment capabilities of the particular equipment using the mask.

The dimensions of the moat 403 are discussed next. In this embodiment, the moat 403 is transparent in the completed mask. Thus moat 403 corresponds to a region of exposed opaque material during the opaque material etch step. The moat width 411 is generally a function of two constraints: plasma species diffusional length and mask manufacturing tolerances. By keeping the resist layer material of inactive region 404 placed beyond a plasma species diffusion length, its effect on the plasma species density near the active device area 401 edges should be minimized. This sets a lower bound on the moat width.

Plasma based etches, such as RIE based etches, involve a complicated combination of various product species, intermediate species and reactant species within the plasma. To first order, the diffusion length of a species is closely related to the species' mean free path. Thus, for one chromium etch embodiment having 50 mTorr pressure and 25 C temperature, the mean free path for an oxygen radical is 9.5 mm, while for a chlorine radical it is 3.5 mm, according to the following equation:

$$\lambda = \frac{1}{\sqrt{2}\,\pi d_o^2 n} \qquad \text{Eqn. 1}$$

In Equation 1, $d_o$ is the effective diameter of the species, such as 0.120 nm for an oxygen radical, and n is the density. The density is dictated by the process temperature and pressure. The species dictates the cross-section for collisional interactions and is related to the effective diameter.

As mentioned above, plasma based etches, such as RIE based etches, involve a complicated combination of various product species, intermediate species and reactant species within the plasma. High density plasmas, as is known in the art, have higher concentrations of species within the plasma. The various species are single atoms and molecules formed with atoms from elements such as oxygen (O), chlorine (Cl), flourine (F) and hydrogen (H). This plasma may contain ionized and neutral molecules and single atoms.

The elements listed above are a list of typical elements found within plasmas. However, it is important to note that typical plasmas have other atoms, such as chromium (Cr), in lieu of or in combination with O, Cl, F and H. The presence of these other elements increases the complexity, such as the number of possible species combinations, within the plasma since they typically can form molecules with O, Cl, F and H alone or with various combinations of O, Cl, F and H. For example, different molecules based upon CrO, CrCl, or $CrO_2Cl_2$ are all possible within a plasma.

Furthermore, many of the above elements may exist within the plasma by themselves as a single atom, such as an H atom, or as a molecule such as $O_2$ or $Cl_2$. Again, these may be ionic or electrostatically neutral. Thus, the number of possible molecules or single atoms within a plasma that stem from each of the elements present in the plasma is very large.

Each type of molecule or single atom within a plasma corresponds to a species within the plasma. Since the minimum bound of the moat width 411 is related to plasma species diffusional length and without full knowledge of all the reactant species that exist in the plasma used to etch our mask, as is typical in the art, we have relied on empirical data to determine moat width 411.

Based on our empirical data, we have found that for a 50 mTorr plasma, a moat width of 10 mm was sufficient to deliver the desired CD improvement on a clearfield mask. As our plasma contains oxygen, which by itself has a reactant length of 9.5 mm as discussed above, note that our moat width 411 is comparable to the diffusional length of oxygen.

It is therefore possible that oxygen or oxygen based molecules are a dominant species within our plasma and/or represent the species having the longest diffusional length. Dominant species are those species whose density within a plasma are most affected by reduced density by resist loading. For example, dominant species may be those species that favor reactions with the resist as compared to other species. The presence of resist lowers the proximate density of oxygen.

Thus, moving the moat width 411 beyond the one or more dominant species' diffusional length(s) should noticeably reduce CD variation. Since oxygen reacts heavily with available resists, we believe that oxygen and/or molecules based upon oxygen may be a dominant species within our plasma.

An alternate theory concerns the fact that oxygen may have one of the longer diffusional lengths of the species types. For example, recall that the diffusional length of oxygen is 9.5 mm and nearly three times the diffusional length of a monotonic chlorine species of 3.5 mm. Our moat width of 10.0 mm may therefore represent a distance greater than the species having the longest diffusional length. Alternatively, combining the two above perspectives, oxygen may represent the longest, dominant species within our plasma. Thus, in such a case, our moat width 411 of 10.0 mm is greater than the longest, dominant species within our plasma.

The 10.0 mm moat width 411 of our embodiment may also represent a weighted diffusional length of the entire plasma. For example, if the diffusional length of each species, where each diffusional length has a coefficient related to the dominance of its corresponding species, is summed over all the species within the plasma, an effective diffusional length of the entire plasma is produced. Given oxygen's strong reaction with available resists, we would anticipate the oxygen term(s) to dominate such an effective diffusional length expression.

Since critical dimension variation drops with increasing moat width, the transparent moat width 411 could in principle extend ultimately to the mask edge 412 itself. In many applications, the maximum distance of the moat width 411 may be constrained by manufacturing issues. There are generally three constraints that limit the maximum extent of the moat width 411. First, there are features in the inactive area 404, such as alignment marks 420a–d, that should typically not be covered by the moat 403. Second, a larger moat width 411 increases the amount of opaque layer to clear during the etch step, leading to a longer required etch time and more resist loss than necessary. Greater resist loss generally degrades etch profiles, CD range and optical proximity correction (OPC) fidelity. Finally, the radiation exposure process is typically a slow, cumbersome and expensive process in mask manufacturing. Thus, in order to fabricate cost effective masks, the amount of exposure area used to create the moat 403 should be reduced where possible.

Thus one may use: 1) Equation 1 in light of a plasma species' expected diffusional lengths and/or dominance, consistent with one or more of the theories discussed above; or 2) an empirical approach, such as varying moat widths about values calculated above, to obtain an optimum moat width 411.

In addition to the use of a moat surrounding the active area 401, the inventors have discovered that overexposing the moat 403 to radiation further reduces CD variation. Thus, the radiation used to form the moat is also controlled to have a differential increased incident energy. Specifically, the application of an increased differential energy dosage from the E-beam projector to the moat 403 further corrects for process induced CD variation. Preferably, the increased radiation dosage is on the order of 5%–100% of the normal energy required to clear the resist layer from the moat 403. It has been found experimentally that the increased radiation dosage will depend on the resist thickness, resist composition, distance of the moat to the active area, and other factors. For example, generally the further the moat is from the active area, the greater the over dosage should be.

The additional E-beam dose on the moat 403 induces a resist develop effect and profile variation to control the CD variation. The active device area 401 is patterned with the E-beam at a different dosage and address unit versus the moat 403. The E-beam dosage on the moat 403 results in improved CD variation. It is believed that the additional E-beam dosage accomplishes this by resist heating, charging, variation of resist dissolution kinetics from multiple reflected and scattered electrons.

The technique discussed above may also be applied to photomasks that do not have a moat. In other words, referring back to the prior art photomask 100 of FIG. 1, radiation could be applied to the inactive area 102 of the photomask 100. Normally, in the prior art, no radiation is applied to the inactive area 102. Only the active area 101 is exposed to radiation. However, in accordance with the present invention, radiation is applied to at least a portion of the inactive area 102. One drawback of this technique is that the time required to pattern the entire photomask 100 with radiation may be substantially higher than the prior art. However, for applications where CD variation is critical, the technique may still be advantageously used.

One option to minimize the time required to irradiate the photomask 100 is to only irradiate a portion of the inactive area 102. Typically, the preferred portion of the inactive area 102 should be that portion that is closest to the active area 101, thus not unlike the location and shape of the moats discussed above. Of course, the amount of radiation incident on the inactive area 102 should be less than the amount of radiation required to completely cause the resist to be removed during development. Preferably, the radiation dosage should be on the order of 10%–75% of the dosage required to clear the resist.

What is claimed is:

1. A method comprising:
    depositing a resist layer on a mask substrate having transparent and opaque layers;
    selectively irradiating said resist layer on an active device area thereof to radiation to produce features on said resist within said active device area;
    selectively irradiating said resist layer to radiation to produce a moat substantially surrounding said active device area; and
    further irradiating said moat to an additional differential dosage of radiation beyond what is necessary to form said moat.

2. The method of claim 1 further wherein said moat has a width greater than a plasma species diffusional length.

3. The method of claim 1 further comprising etching said opaque layer by a plasma etch.

4. The method of claim 1 wherein said radiation is in the form of an E-beam.

5. The method of claim 1 wherein said additional radiation is between 5%–50% of the energy necessary to form said moat.

6. A method comprising:
    depositing a resist layer on a mask substrate having transparent and opaque layers;
    selectively irradiating said resist layer on an active device area to radiation to produce features on said resist within said active device area; and
    selectively irradiating said resist layer to radiation to produce a moat substantially surrounding said active device area, wherein said radiation is greater than what is necessary to form said moat.

7. The method of claim 6 wherein said radiation is between 5%–50% more than the radiation necessary to form said moat.

8. The method of claim 6 wherein said radiation is in the form of an E-beam.

9. The method of claim 6 further comprising etching said opaque layer by a plasma etch.

10. The method of claim 6 further wherein said moat has a width greater than a plasma species diffusional length.

11. An apparatus comprising:
a mask having a transparent layer and an opaque layer;
an active device area on said mask; and
a moat on said mask substantially surrounding said active device area, said moat formed by exposing a resist layer to an amount of radiation greater than what is necessary to form said moat.

12. The apparatus of claim 11 wherein said moat has a width tailored to be greater than a plasma species diffusional length during an opaque layer etch.

13. A method of forming a photomask having an active device area and an inactive area comprising:
depositing a resist layer on a mask substrate having a transparent layer and an opaque layer;
selectively irradiating said resist layer on said active device area to radiation to produce features on said resist within said active device area; and
selectively irradiating said resist layer on at least a portion of said inactive area.

14. The method of claim 13 wherein selectively irradiating said resist layer on at least a portion of said inactive area is less than the amount of radiation necessary to remove said resist layer from said portion of said inactive area during development.

15. The method of claim 13 wherein radiation directed to said inactive area is 10%–75% of the amount of radiation necessary to clear said resist.

16. The method of claim 13 further including developing said resist layer.

17. The method of claim 13 further comprising etching said opaque layer by a plasma etch.

18. An apparatus comprising:
a mask having a transparent layer and an opaque layer;
an active device area on said mask;
a moat on said mask substantially surrounding said active device area; and
an opaque alignment frame formed within said moat, wherein said moat is formed by exposing a resist layer to an amount of radiation greater than what is necessary to form said moat.

19. The apparatus of claim 18 wherein said moat has a width tailored to be greater than a plasma species diffusional length during an opaque layer etch.

20. The apparatus of claim 18 wherein said opaque layer further comprises an anti reflective coating.

* * * * *